(12) United States Patent
Komuro

(10) Patent No.: US 7,833,909 B2
(45) Date of Patent: Nov. 16, 2010

(54) METHOD OF MANUFACTURING SEMICONDUCTOR DEVICE, AND ETCHING APPARATUS

(75) Inventor: Masahiro Komuro, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/385,845

(22) Filed: Apr. 21, 2009

(65) Prior Publication Data

US 2010/0144154 A1 Jun. 10, 2010

(30) Foreign Application Priority Data

May 12, 2008 (JP) ............................. 2008-125051

(51) Int. Cl.
*H01L 21/311* (2006.01)

(52) U.S. Cl. ................ 438/700; 438/710; 438/944; 427/250; 427/251; 427/252; 427/253; 427/254; 216/12

(58) Field of Classification Search ........................ None
See application file for complete search history.

(56) References Cited

U.S. PATENT DOCUMENTS

| | | | | |
|---|---|---|---|---|
| 5,328,722 A | * | 7/1994 | Ghanayem et al. | ........... 427/250 |
| 5,476,548 A | * | 12/1995 | Lei et al. | ..................... 118/728 |
| 5,556,476 A | * | 9/1996 | Lei et al. | ..................... 118/728 |
| 5,695,831 A | * | 12/1997 | Miyazaki | ..................... 427/576 |
| 5,766,365 A | * | 6/1998 | Umotoy et al. | .............. 118/728 |
| 5,888,304 A | * | 3/1999 | Umotoy et al. | .............. 118/720 |
| 6,022,809 A | * | 2/2000 | Fan | ............... 438/710 |
| 6,096,135 A | * | 8/2000 | Guo et al. | .................... 118/729 |
| 6,186,092 B1 | * | 2/2001 | Tsai et al. | .................... 118/728 |
| 6,231,674 B1 | * | 5/2001 | Chen et al. | .................... 118/720 |
| 6,328,808 B1 | * | 12/2001 | Tsai et al. | .................... 118/729 |
| 6,374,512 B1 | * | 4/2002 | Guo et al. | ....................... 34/362 |
| 6,375,748 B1 | * | 4/2002 | Yudovsky et al. | ............ 118/728 |
| 6,436,192 B2 | * | 8/2002 | Chen et al. | .................... 118/696 |
| 6,589,352 B1 | * | 7/2003 | Yudovsky et al. | ........... 118/729 |
| 2003/0226822 A1 | * | 12/2003 | Li et al. | ......................... 216/63 |
| 2004/0000375 A1 | * | 1/2004 | Liu et al. | .................. 156/345.3 |

FOREIGN PATENT DOCUMENTS

| | | |
|---|---|---|
| JP | 2002-294441 | 10/2002 |
| JP | 2002-334879 | 11/2002 |
| JP | 2006-118004 | 5/2006 |

\* cited by examiner

*Primary Examiner*—Ha Tran T Nguyen
*Assistant Examiner*—Shantanu C Pathak
(74) *Attorney, Agent, or Firm*—McGinn IP Law Group, PLLC

(57) ABSTRACT

Aimed at suppressing roughening in a circumferential portion of a layer to be etched in the process of removing a hard mask formed thereon, an etching apparatus of the present invention has a process chamber, an electrode, a stage, and a shadow ring, wherein the process chamber allows an etching gas to be introduced therein; the electrode is disposed in the process chamber, and is used for generating plasma by ionizing the etching gas; the stage is disposed in the process chamber, onto which a substrate is disposed; the shadow ring has an irregular pattern on the inner circumferential edge thereof, and is disposed in the process chamber and placed above the stage 30, so as to cover a circumferential portion and an inner region adjacent thereto of the substrate in a non-contact manner.

5 Claims, 6 Drawing Sheets

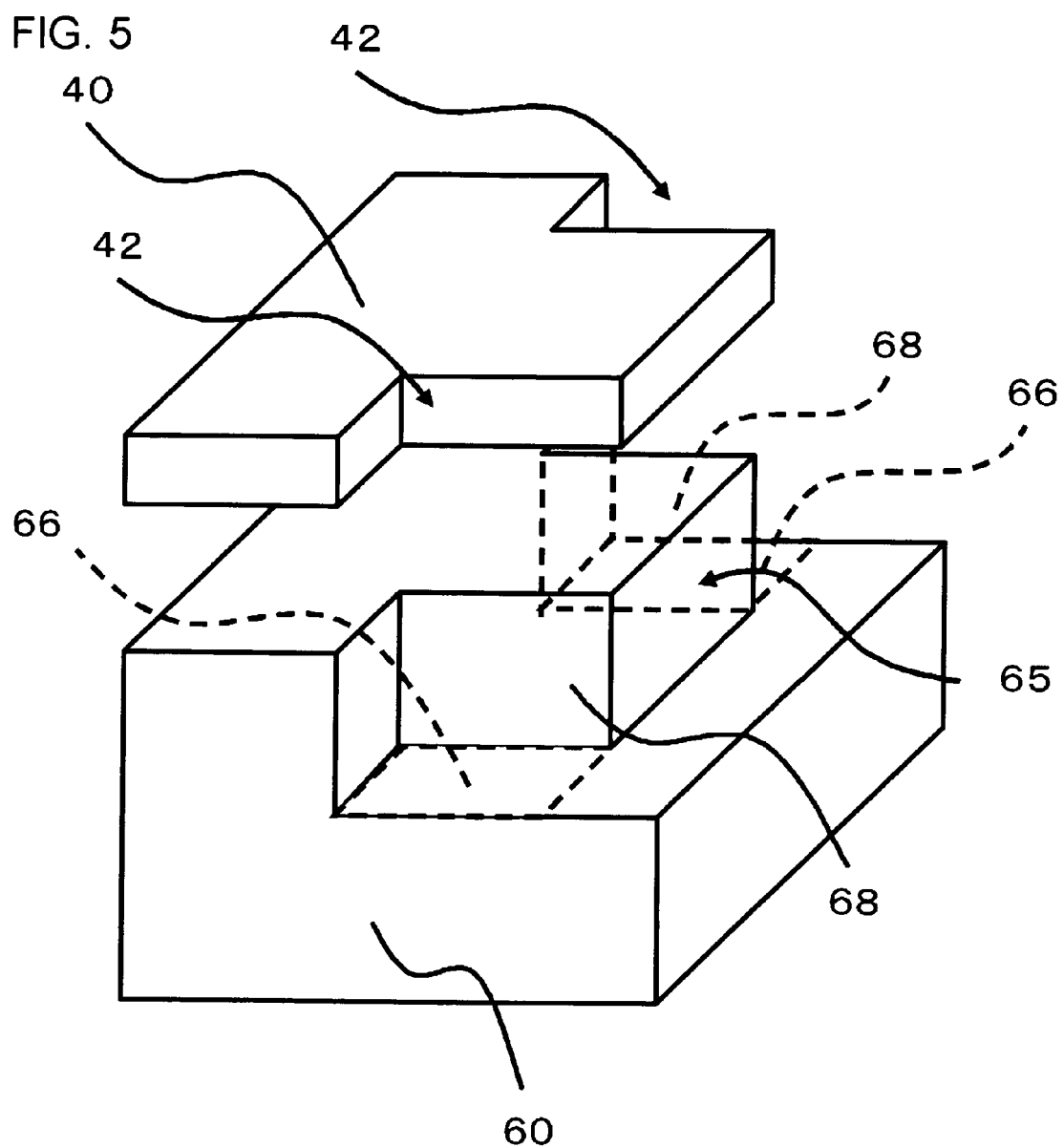

METHOD OF MANUFACTURING SEMICONDUCTOR DEVICE, AND ETCHING APPARATUS

This application is based on Japanese patent application No. 2008-125051 the content of which is incorporated hereinto by reference.

BACKGROUND

1. Technical Field

The present invention relates to a method of manufacturing a semiconductor device making use of a shadow ring, and an etching apparatus.

2. Related Art

A shadow ring is occasionally used for an etching apparatus or a film-making apparatus used for manufacture of semiconductor devices. The shadow ring is a ring-form component disposed so as to cover a circumferential portion of a substrate, aimed at preventing a certain width of region ranging from the edge of the substrate from being etched or deposited with any film (see Japanese Laid-Open Patent Publication Nos. 2002-294441 and 2006-118004, for example). Without the shadow ring, the process would have an increased number of steps in the manufacturing, including a step of grinding the circumferential portion of the film so as to remove the deposited film.

One step of using the shadow ring is known as a step of forming relatively deep trenches or holes to a layer to be etched. This step is such as forming a hard mask, typically composed of a silicon oxide film, on the layer to be etched, and then etching the layer using the hard mask as a mask. In this step, there is no hard mask formed in the circumferential portion of the layer to be etched, for the purpose of preventing generation of foreign matters from the hard mask in the process of handling. The shadow ring is used to protect the circumferential portion of the layer to be etched during etching.

On the other hand, Japanese Laid-Open Patent Publication No. 2002-334879 describes a technique of forming a protective film on an insulating film formed on a wafer, specifically in the bevel region thereof in order to protect the insulating film in the bevel region.

The hard mask is removed by etching, after the trenches or holes are formed. However, in this process, also the circumferential portion of the layer to be etched is slightly etched. For this reason, the layer to be etched may be roughened in the circumferential portion, if the etching for removing the hard mask takes a long time.

SUMMARY

According to the present invention, there is provided a method of manufacturing a semiconductor device which includes:

forming a hard mask having an opening pattern, on a layer to be etched over a region excluding an outer circumferential portion;

forming trenches or holes in the layer to be etched conforming to the opening pattern by dry etching, while covering a region of the hard mask adjacent to the circumferential portion, and the circumferential portion, with a shadow ring in a non-contact manner; and removing the hard mask by etching, wherein the shadow ring has an irregular pattern on the inner circumferential edge thereof.

In the step of forming the trenches or holes in the layer to be etched, also the hard mask is slightly etched in a region not covered by the shadow ring. Since the shadow ring has the irregular pattern on the inner circumferential edge thereof, the irregular pattern of the shadow ring is transferred to the etched region of the hard mask. The hard mask has, therefore, an increased surface area, and may be etched within a short time in the step of removal. Accordingly, the circumferential portion of the layer to be etched may be suppressed from being roughened.

According to the present invention, there is provided also an etching apparatus which includes:

a process chamber into which an etching gas is introduced;

an electrode for generating plasma disposed in the process chamber;

a stage disposed in the process chamber, on which a substrate is placed; and a shadow ring disposed in the process chamber and placed above the stage, so as to cover the circumferential portion and an inner region adjacent thereto of the substrate in a non-contact manner, wherein the shadow ring has an irregular pattern on the inner circumferential edge thereof.

According to the present invention, the circumferential portion of the layer to be etched may be suppressed from being roughened.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 5 is a schematic perspective view explaining an operation of the shadow ring illustrated in FIG. 4A.

DETAILED DESCRIPTION

Figure 1:
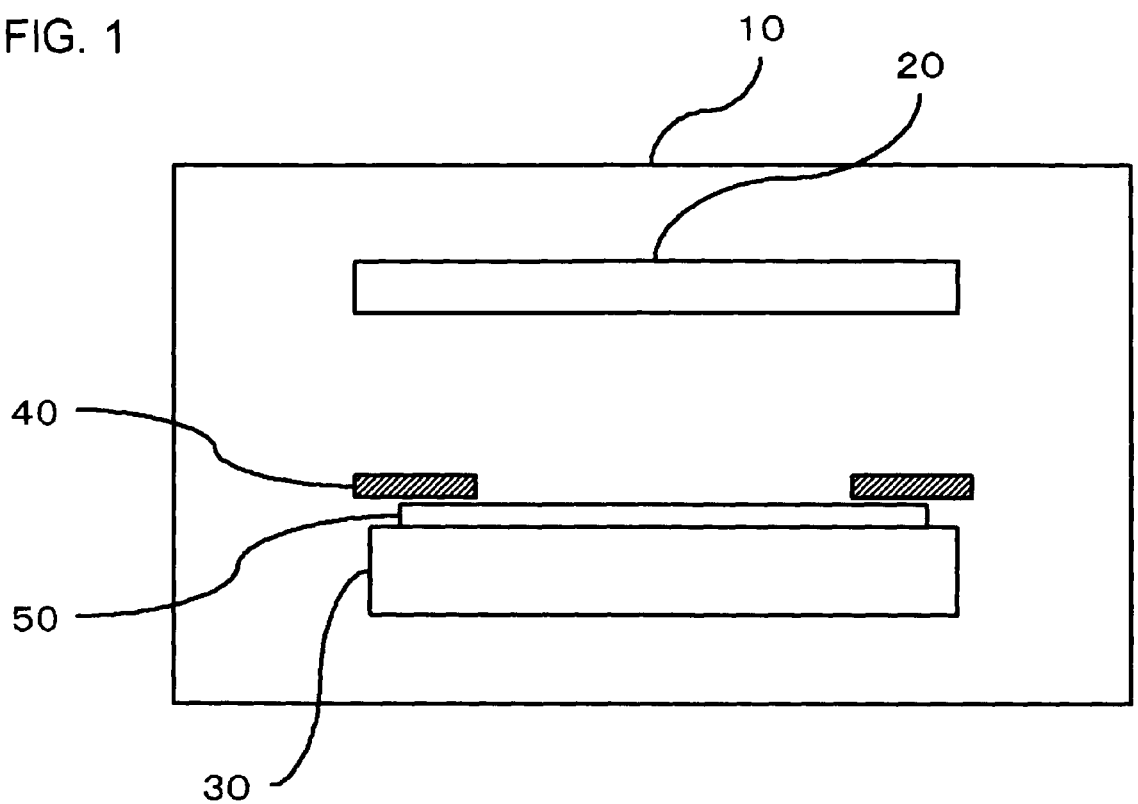
FIG. 1 is a drawing illustrating a configuration of an etching apparatus used for a method of manufacturing a semiconductor device in one embodiment.

The invention will now be described herein with reference to an illustrative embodiment. Those skilled in the art will recognize that many alternative embodiments can be accomplished using the teachings of the present invention and that the invention is not limited to the embodiment illustrated for explanatory purposes.

Embodiment of the present invention will be explained below. Note that any similar constituents will be given with similar reference numerals or symbols in all drawings, so that explanations therefor will not be repeated.

FIG. 1 is a drawing illustrating a configuration of an etching apparatus used for the method of manufacturing a semiconductor device according to this embodiment. The etching apparatus has a process chamber 10, an electrode 20, a stage 30, and a shadow ring 40. The process chamber 10 allows an etching gas to be introduced therein. The electrode 20 is disposed in the process chamber 10, and is used for generating plasma by ionizing the etching gas. The stage 30 is disposed in the process chamber 10, onto which a substrate 50 is disposed. The shadow ring 40 is disposed in the process chamber 10 and placed above the stage 30, so as to cover a circumferential portion and an inner region adjacent thereto of the substrate 50 in a non-contact manner. The shadow ring 40 has an irregular pattern on the inner circumferential edge thereof.

The substrate 50 has a layer to be etched. The layer to be etched may be a surficial portion of the substrate 50, or may be a film formed over the substrate 50, or may be a semiconductor layer of an SOI substrate. When the layer to be etched is etched, a hard mask having an opening pattern is formed over the layer to be etched. The hard mask herein is not formed in the circumferential portion of the layer to be etched. Dry etching is proceeded while covering a region of the hard mask adjacent to the circumferential portion, and the circumferential portion of the layer to be etched, with a shadow ring in a non-contact manner. By this step, the trenches or holes are formed in the layer to be etched conforming to the opening pattern, wherein also a portion of the hard mask not covered with the shadow ring 40 is partially removed. The hard mask is then removed by etching.

As described in the above, the shadow ring 40 has an irregular pattern on the inner circumferential edge thereof. The irregular pattern of the shadow ring 40 is therefore transferred to the hard mask positioned below the shadow ring 40. The hard mask has, therefore, an increased area to be brought into contact with an etching solution or etching gas, and may be etched within a short time in the step of removal. Accordingly, the circumferential portion of the layer to be etched may be suppressed from being roughened. The process will be detailed below.

Figure 2:
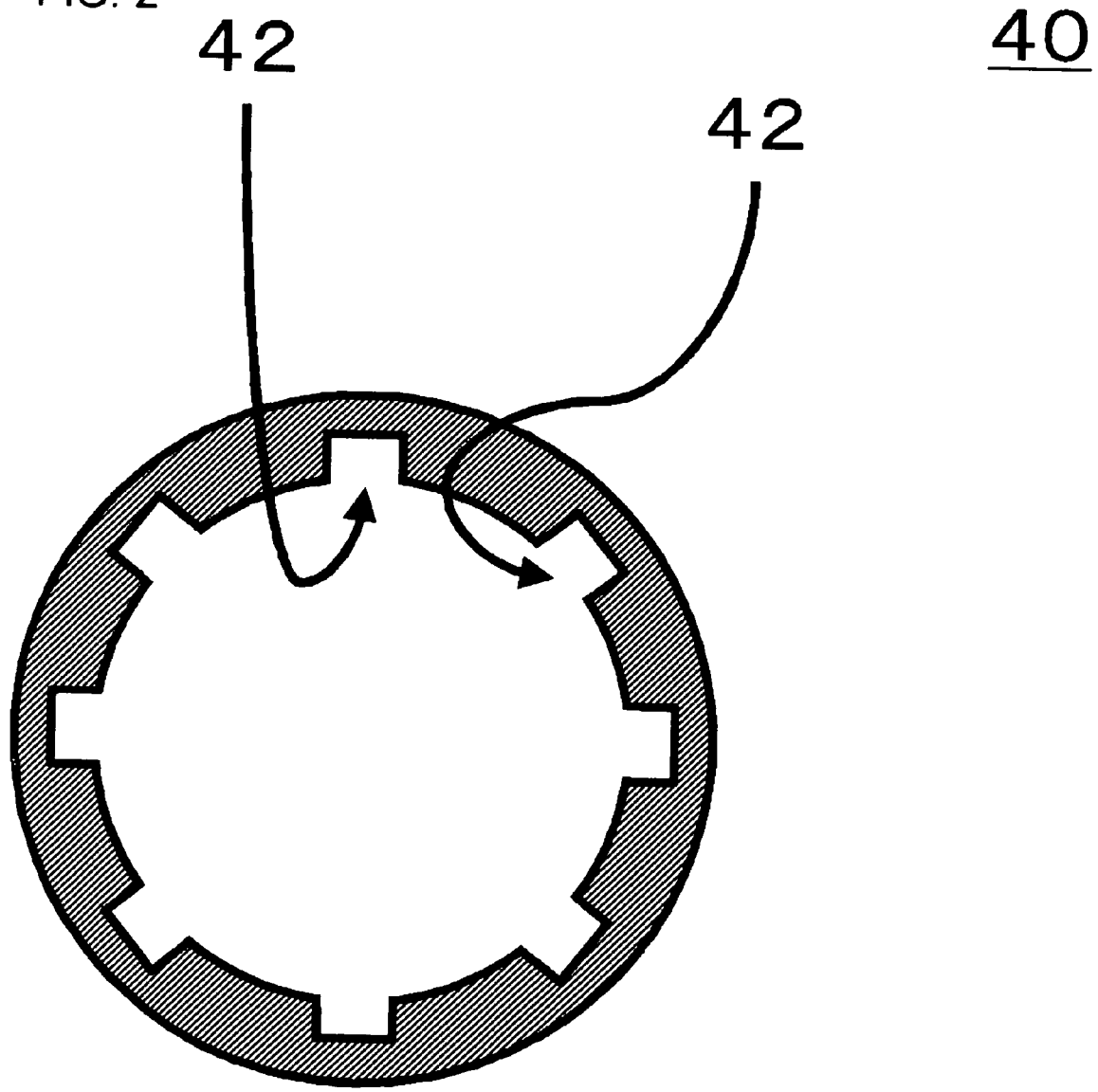
FIG. 2 is a plan view illustrating an example of a shadow ring.

FIG. 2 is a plan view illustrating an example of the shadow ring 40. In the example illustrated in the drawing, the shadow ring 40 has a plurality of recesses 42 at regular intervals on the inner circumferential surface thereof. The plan geometry of each recess 42 is rectangle or square. In the example illustrated in the drawing, the width of each recess 42 is smaller than the distance between the adjacent recesses 42. The shadow ring 40 is typically made of alumina.

FIGS. 3A to 4B are sectional views sequentially showing steps of forming the recesses or holes in the surficial portion of the substrate 50 which serves as the layer to be etched. FIG. 5 is a schematic perspective view explaining an operation of the shadow ring 40 illustrated in FIG. 4A. The substrate 50 is typically composed of a semiconductor wafer such as a Si wafer.

Figure 3A:
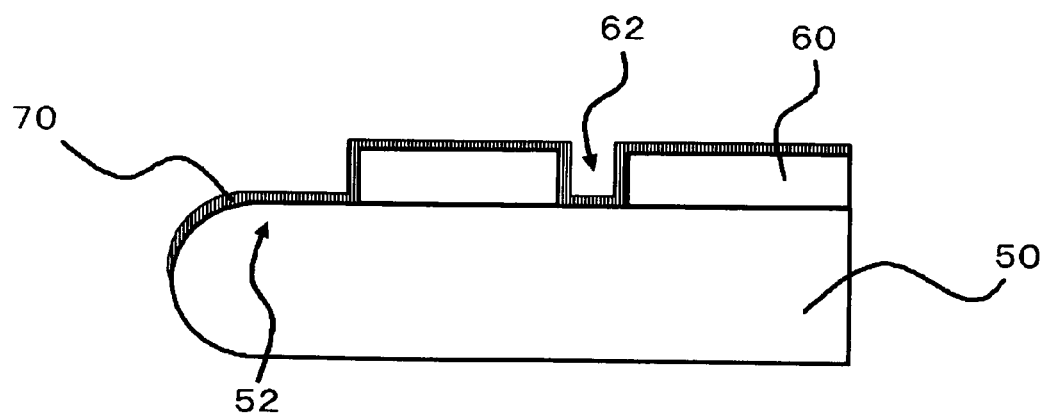
FIGS. 3A to 4B are sectional views sequentially illustrating steps of forming recesses or holes in the surficial portion of the substrate as the layer to be etched.

First, as illustrated in FIG. 3A, a hard mask 60 is formed over the substrate 50. The hard mask 60 is typically a silicon oxide film, silicon nitride film, silicon oxide nitrogen, silicon nitrogen oxide, or a stacked film of at least two of these films, having an opening pattern 62. A portion of the hard mask 60 positioned on the circumferential portion 52 of the substrate 50 is removed, typically when the opening pattern 62 is formed in the hard mask 60. The thickness of the hard mask 60 is typically 0.3 μm or larger and 5 μm or smaller.

Next, an etching protection film 70 is formed over the circumferential portion 52 of the substrate 50. The etching protection film 70 is typically composed of the same material with the hard mask 60. The etching protection film 70 is thinner than the hard mask 60, and has a thickness of 10 nm or larger and 200 nm or smaller, for example. Since the etching protection film 70 is formed by vapor-phase deposition (CVD, for example), so that the film is formed also on the hard mask 60 and in the opening pattern 62.

The hard mask 60 and the etching protection film 70 are formed in a process chamber different from the process chamber 10.

Figure 3B:
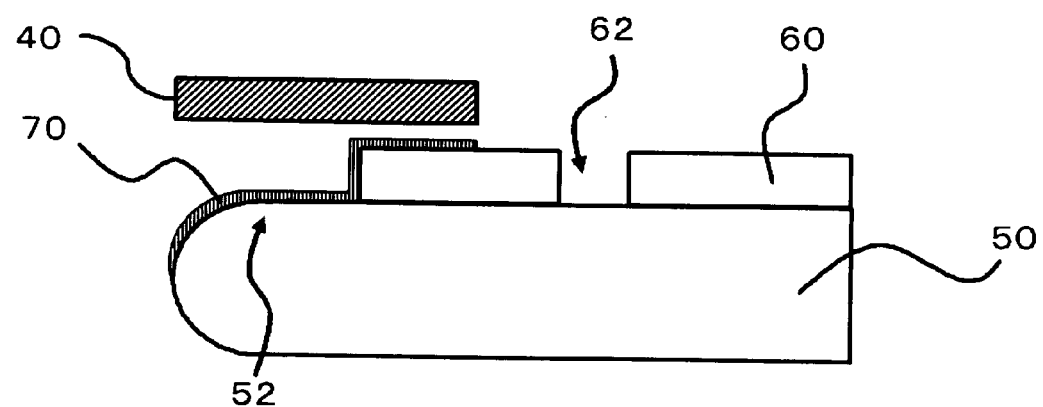

Next, as illustrated in FIG. 3B, the substrate 50 is placed in the process chamber 10 illustrated in FIG. 1, and the shadow ring 40 is positioned over the circumferential portion 52 of the substrate 50 and the portion of the hard mask 60 adjacent to the circumferential portion 52, in a non-contact manner. Next, an inert gas (Ar gas, for example) is introduced into the process chamber 10, and sputtering is carried out using the inert gas. By this process, a portion of the etching protection film 70 not covered with the shadow ring 40 (including portions of the etching protection film 70 formed in the opening pattern 62), and a native oxide film positioned on the surficial portion of the substrate 50 in the opening pattern 62 are removed. This step may be proceeded also by etching, typically dry etching.

Figure 4A:
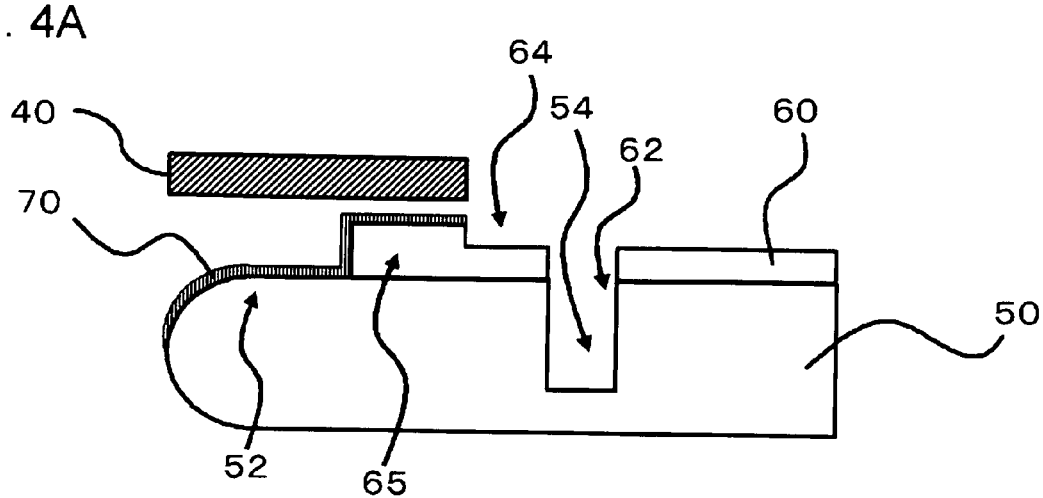

Next, as illustrated in FIG. 4A, an etching gas is introduced into the process chamber 10, and the substrate 50 is etched using the etching gas. By this process, trenches or holes 54 are formed in the portion of the substrate positioned in the opening pattern 60. The trenches or holes 54 are typically trenches to be filled with a device isolation film, or holes to be filled with through-electrode which extend vertically through the substrate 50, or holes for forming trench capacitors.

Since the circumferential portion 52 of the substrate 50 in this step of etching is covered with the shadow ring 40, the etching gas may be less likely to reach the circumferential portion 52. The circumferential portion 52 is covered also with the etching protection film 70. Accordingly, the circumferential portion 52 of the substrate 50 may be suppressed from being roughened in this step of etching.

In this step of etching, the portion of the hard mask 60 not covered with the shadow ring 40 is etched to produce a recess 64. An outer peripheral portion 65 of the hard mask 60 will consequently be thickened as compared with the other portion.

As illustrated in FIG. 2 and FIG. 5, the shadow ring 40 has the recesses 42 on the inner circumference edge thereof. As illustrated in FIG. 5, the outer circumference of the recess 64 consequently has an irregularity transferred thereto, conforming to the recesses 42. As a consequence, the surface area of the hard mask 60 increases by contribution of the area of bottom faces 66 and the area of side faces 68 formed corresponding to the side faces of the recess 42.

Figure 4B:
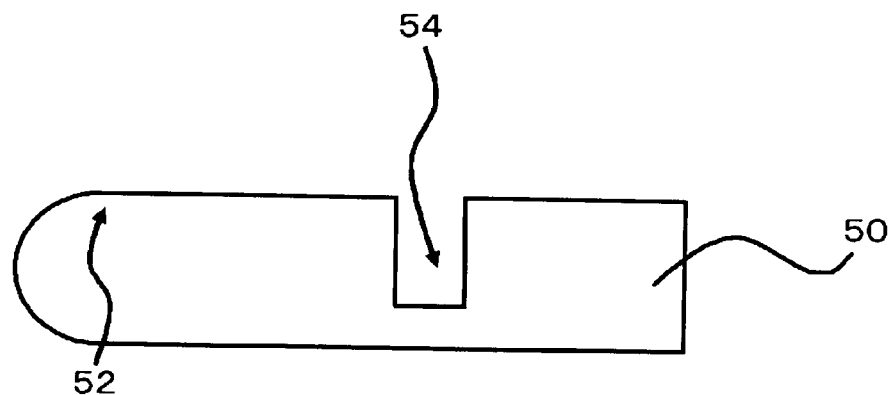

Thereafter, as illustrated in FIG. 4B, the substrate 50 is taken out from the process chamber 10. The hard mask 60 and the etching protection film 70 are then removed typically by wet etching. If the hard mask 60 and the etching protection film 70 are composed of the same material, only a single step of etching will suffice. The outer peripheral portion 65 of the hard mask 60, remained to have no recess 64 formed therein, is therefore thicker as compared with the other portion. For this reason, the length of time necessary for this step may be governed by the length of time necessary for etching of the outer peripheral portion 65 of the hard mask 60.

In this embodiment, as explained referring to FIG. 5, the surface area of the hard mask 60 increases by contribution of the area of bottom faces 66 and the area of side faces 68 formed corresponding to the side faces of the recess 42, as compared with a hard mask possibly obtained by using the shadow ring 40 having no recesses 42 in the inner circumference thereof. Accordingly, the etchrate of the outer peripheral portion 65 of the hard mask 60 increases, and thereby the length of time necessary for the etching may decrease. By virtue of the etching, the circumferential portion 52 of the substrate 50 may consequently be suppressed from being roughened.

As has been described in the above, according to this embodiment, the surface area of the hard mask 60 may be increased by contribution of recesses 42 formed in the inner circumference of the shadow ring 40, in the process of etching for forming the trenches or holes 54 in the substrate 50. As a consequence, the length of time necessary for removing the hard mask 60 may be reduced, and thereby the circumferential portion 52 of the substrate 50 may be suppressed from being roughened.

Also since the shadow ring 40 is used, the circumferential portion 52 of the substrate 50 may be suppressed from being roughened, in the process of etching for forming the trenches or holes 54 in the substrate 50.

Since the circumferential portion 52 is covered with the etching protection film 70 in this embodiment, the circumferential portion 52 may further effectively be suppressed from being roughened, both in the etching for forming the trenches or holes 54, and in the etching for removing the hard mask 60. Since the etching protection film 70 is thinner than the hard mask 60, the etching protection film 70 and the hard mask 60 may be removed together in the same process of etching, if they are composed of the same material.

Although the etching protection film 70 is formed also in the opening pattern 62, the portion of the etching protection film 70 in the opening pattern 62 is removed before the trenches or holes 54 are formed. Therefore, a process for forming the trenches or holes 54 may be prevented from being inhibited by the etching protection film 70.

Figure 6A:
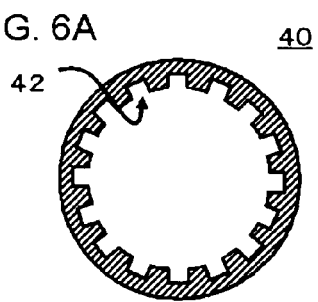
FIGS. 6A to 6E are plan views illustrating other examples of the shadow ring.
Figure 6B:
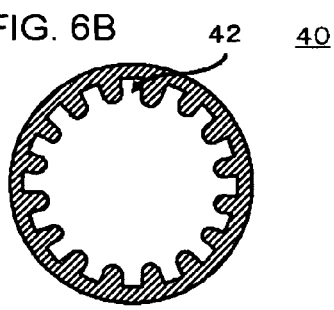
Figure 6C:
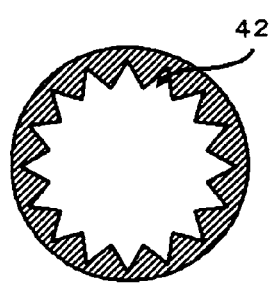
Figure 6D:
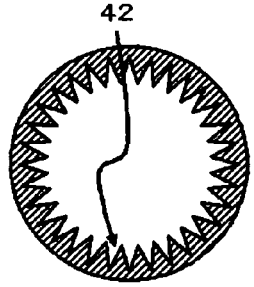
Figure 6E:
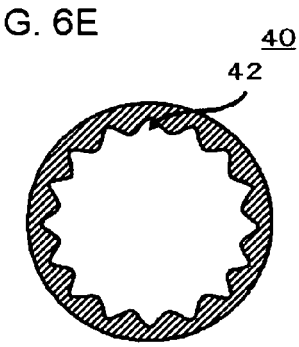

The irregular pattern formed in the inner circumference of the shadow ring 40 is not limited to that illustrated in FIG. 2. For example, as illustrated in FIG. 6A, the number of recesses 42 may be increased. In this case, the etchrate of the outer peripheral portion 65 of the hard mask 60 increases, since the number of the bottom faces 68 and the side faces 68 increases. Alternatively, as illustrated in FIG. 6B, the projections between every adjacent recesses 42 may be rounded. In this case, the projections between every adjacent recesses 42 become less likely to be etched, and thereby the shadow ring 40 may be elongated in the service life thereof. Alternatively, as illustrated in FIGS. 6C and 6D, each recess 42 may have a triangle profile. Also in these cases, the distance between every adjacent recesses 42 may arbitrarily be set. The projections between every adjacent recesses 42 may have triangle, square, or rounded profile. Still alternatively, as illustrated in FIG. 6E, the irregularity in the inner circumference edge of the shadow ring 40 may have a wavy profile.

Alternatively, the etching protection film 70 may not be formed in the steps illustrated in FIGS. 3A to 4B.

The embodiments of the present invention have been described referring to the attached drawings. Note that these embodiments are only for exemplary purposes, while allowing adoption of any configurations other than those described in the above.

It is apparent that the present invention is not limited to the above embodiment, that may be modified and changed without departing from the scope and spirit of the invention.

What is claimed is:

1. A method of manufacturing a semiconductor device comprising:
    forming a hard mask having an opening pattern, on a layer to be etched over a region excluding an outer circumferential portion;
    forming trenches or holes in said layer to be etched conforming to the opening pattern by dry etching, while covering a region of said hard mask adjacent to said circumferential portion, and said circumferential portion, with a shadow ring in a non-contact manner; and
    removing said hard mask by etching,
    wherein said shadow ring has an irregular pattern on the inner circumferential edge thereof.

2. The method of manufacturing a semiconductor device according to claim 1, further comprising, after said forming said hard mask, and before said forming said trench or hole,
    forming an etching protection film on said circumferential portion.

3. The method of manufacturing a semiconductor device according to claim 2,
    wherein said etching protection film is composed of the same material with said hard mask, and is thinner than said hard mask, and
    in said removing said hard mask, also said etching protection film is removed together.

4. The method of manufacturing a semiconductor device according to claim 3,
    wherein the thickness of said etching protection film is 10 nm or larger and 200 nm or smaller, and
    the thickness of said hard mask is 0.3 µm or larger and 5 µm or smaller.

5. The method of manufacturing a semiconductor device according to claim 2,
    wherein in said forming said etching protection film, said etching protection film is initially formed also in said opening pattern,
    and further comprising, after said forming said etching protection film, and before said forming said trenches or holes:
    removing a portion of said etching protection film positioned in said opening pattern by dry etching or sputtering, while covering said circumferential portion with said shadow ring.

* * * * *